(12) United States Patent
Badrou et al.

(10) Patent No.: US 11,093,369 B2
(45) Date of Patent: Aug. 17, 2021

(54) RECONFIGURABLE SIMULATION SYSTEM AND METHOD FOR TESTING FIRMWARE OF STORAGE

(71) Applicant: SK hynix Inc., Gyeonggi-do (KR)

(72) Inventors: Ivan Badrou, Minsk (BY); Sergei Musin, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/573,666

(22) Filed: Sep. 17, 2019

(65) Prior Publication Data

US 2020/0089598 A1 Mar. 19, 2020

Related U.S. Application Data

(60) Provisional application No. 62/733,420, filed on Sep. 19, 2018.

(51) Int. Cl.
*G06F 9/44* (2018.01)
*G06F 11/36* (2006.01)
*G06F 30/20* (2020.01)

(52) U.S. Cl.
CPC ...... *G06F 11/3664* (2013.01); *G06F 11/3684* (2013.01); *G06F 30/20* (2020.01)

(58) Field of Classification Search
CPC ... G06F 11/3664; G06F 11/3684; G06F 30/20
USPC .................................................. 717/124–135
See application file for complete search history.

(56) References Cited

U.S. PATENT DOCUMENTS

| 7,975,084 B1 * | 7/2011 | Kalbarga | G06F 13/102 710/104 |
| 7,996,726 B2 | 8/2011 | Ito | |
| 8,880,779 B2 * | 11/2014 | Fai | G06F 11/263 711/103 |
| 8,949,568 B2 | 2/2015 | Wei et al. | |
| 9,171,585 B2 * | 10/2015 | Rajan | G11C 5/06 |
| 9,710,317 B2 * | 7/2017 | Gupta | G06F 3/0653 |
| 9,851,910 B2 * | 12/2017 | Cohen | G06F 3/0619 |
| 10,043,575 B2 * | 8/2018 | Pignatelli | G06F 3/0647 |
| 2014/0192583 A1 * | 7/2014 | Rajan | G11C 5/06 365/63 |
| 2020/0042201 A1 * | 2/2020 | Huang | G06F 3/0631 |

OTHER PUBLICATIONS

Donghyun Gouk et al., "Amber*: Enabling Precise Full-System Simulation with Detailed Modeling of All SSD Resources", 2018, IEEE, pp. 469-481. (Year: 2018).*
Yixin Luo, "Architectural Techniques for Improving NAND Flash Memory Reliability", Mar. 2018, School of Computer Science Carnegie Mellon University, 255 pages. (Year: 2018).*

(Continued)

*Primary Examiner* — Ted T. Vo
(74) *Attorney, Agent, or Firm* — IP & T Group LLP

(57) ABSTRACT

A simulation system is provided for memory systems. The simulation system includes: a test device suitable for generating a test command; and a virtual device suitable for configuring at least one of multiple subsystems and a storage, each subsystem including firmware, configured for a firmware development stage, and performing a test on corresponding firmware of each configured subsystem with the storage using the test command.

20 Claims, 14 Drawing Sheets

(56) References Cited

OTHER PUBLICATIONS

Steve Burke, "How SSDs Are Made: Phases of Solid-State Drive Development", 10, 2012, retrieved from https://www.gamersnexus.net/guides/956-how-ssds-are-made , 9 pages. (Year: 2012).*
Shin, J. et al, Copycat: A High Precision Real Time NAND Simulator, ArXiv, 2016.
Tavakkol, A. et al., MQSim: A Framework for Enabling Realistic Studies of Modern Multi-Queue SSD Devices, USENIX Association, 16th USENIX Conference on File and Storage Technologies, Feb. 12-15, 2018, pp. 49-65, Oakland, CA, USA.
Grenning, J. W., Test-Driven Development for Embedded C, Apr. 2011, Version: 2011-4-6, Pragmatic Bookshelf.
Zuolo L et al., SSDExplorer: a Virtual Platform for Fine-Grained Design Space Exploration of Solid State Drives, Politecnico Di Torino, 2014, pp. 1-6, IEEE.

* cited by examiner

FIG. 8

| Feature/Set | FS 1.1 | FS 1.2 | FS 1.3 | FS 1.4 |
|---|---|---|---|---|
| Fault Injector | − | + | + | + |
| Storage | + | + | + | + |
| Preconditioning | − | − | + | + |
| White Box Test (Host/FTL) | − | − | + | + |
| EOL (End of Life) Test | − | + | + | − |
| Fast Simulation | + | + | − | − |

RECONFIGURABLE SIMULATION SYSTEM AND METHOD FOR TESTING FIRMWARE OF STORAGE

CROSS-REFERENCE TO RELATED APPLICATION

This application claims the benefit of U.S. Provisional Application No. 62/733,420, filed on Sep. 19, 2018, the entire contents of which are incorporated herein by reference.

BACKGROUND

1. Field

Embodiments of the present disclosure relate to simulation for testing firmware of storage.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs).

Memory systems such as NAND flash-based SSDs include various hardware and firmware components. The hardware and firmware components are developed in tandem. Firmware determines the major features of memory systems (e.g., SSD controller). To get best performance and power consumption, firmware needs to be fine tuned on well-optimized hardware. Simulators may be used during firmware development.

SUMMARY

Aspects of the present invention are directed to a reconfigurable simulation scheme for testing firmware during firmware Is development of a memory system.

In one aspect, a simulation system for memory system includes: a test device suitable for generating a test command; and a virtual device suitable for configuring at least one of multiple subsystems and a storage, each subsystem including firmware, configured for a firmware development stage, and performing a test on corresponding firmware of each configured subsystem with the storage using the test command.

In another aspect, a method for simulating a memory system includes: configuring at least one of multiple subsystems and a storage, each subsystem including firmware, configured for a firmware development stage; and performing a test on corresponding firmware of each configured subsystem with the storage using a test command.

Additional aspects of the present invention will become apparent from the following description.

BRIEF DESCRIPTION OF THE DRAWINGS

FIG. 8 is a diagram illustrating simulation feature sets in accordance with an embodiment of the present invention.

DETAILED DESCRIPTION

Figure 1:
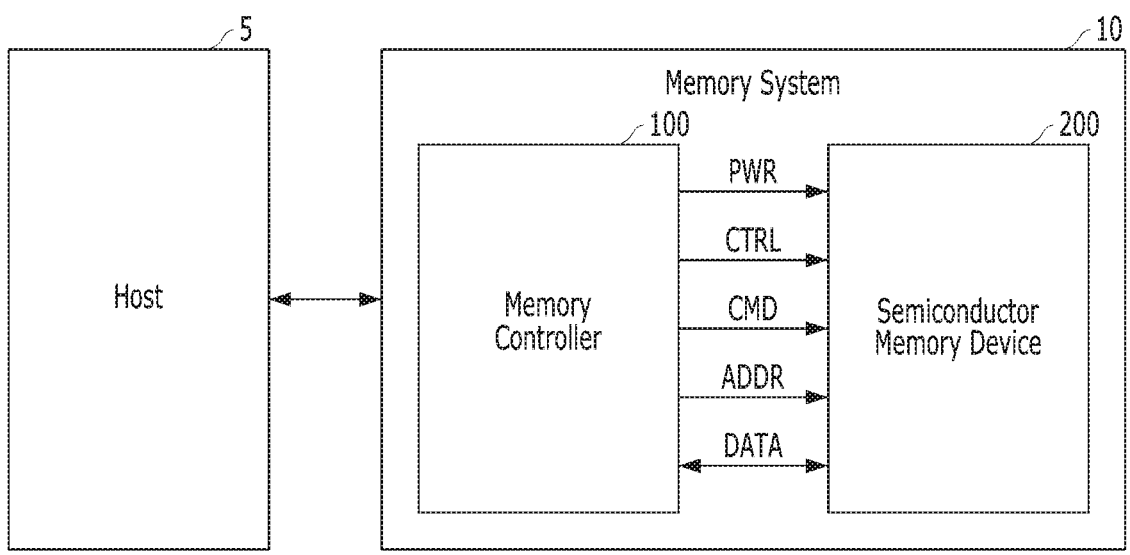
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the is scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing is system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200. For simplicity, memory controller 100 and semiconductor memory device 200 may sometimes be referred to below as controller 100 and memory device 200, respectively.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g, host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
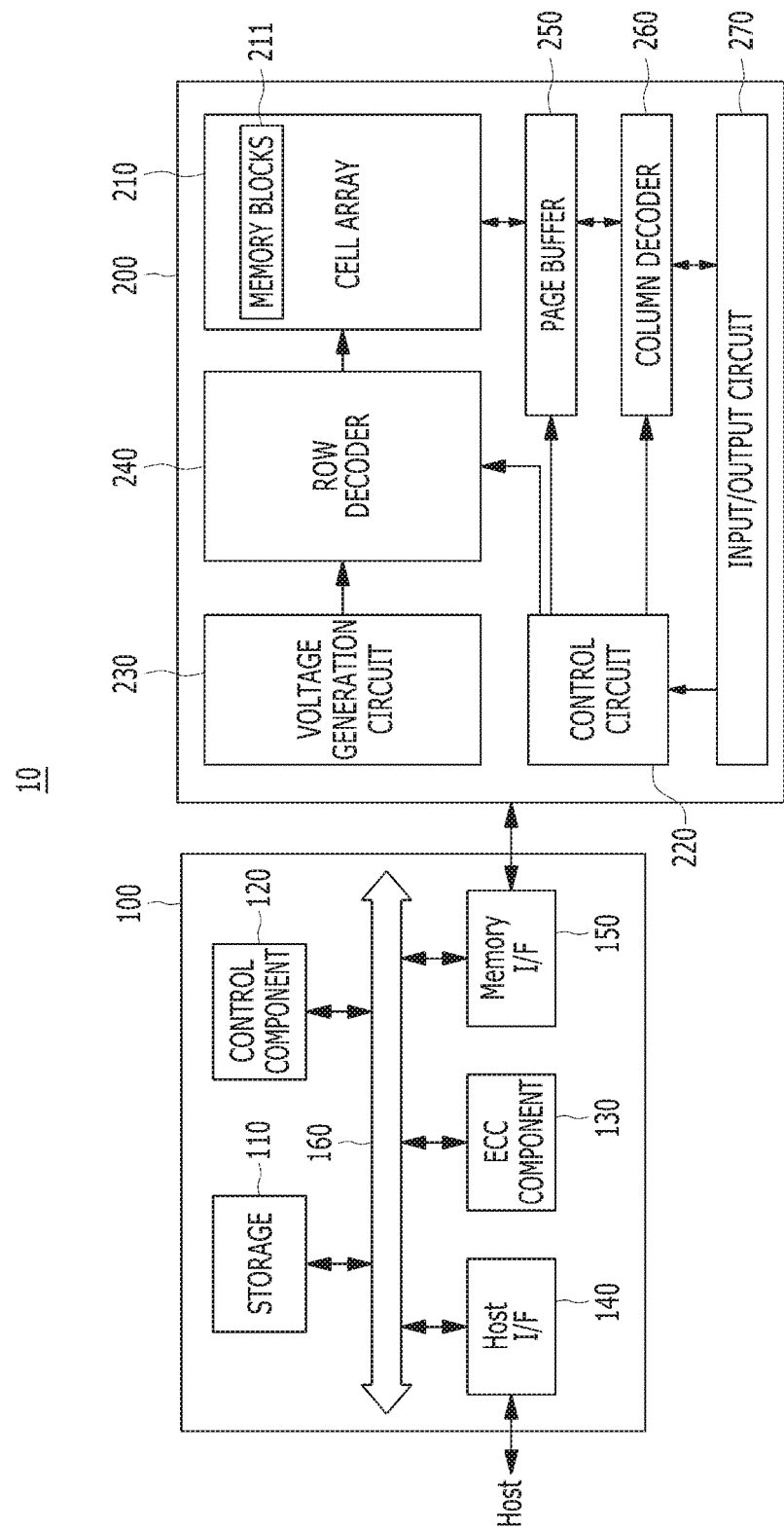
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), an integrated drive electronics (IDE), a non-volatile memory express (NVMe) and a universal flash storage (UFS).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
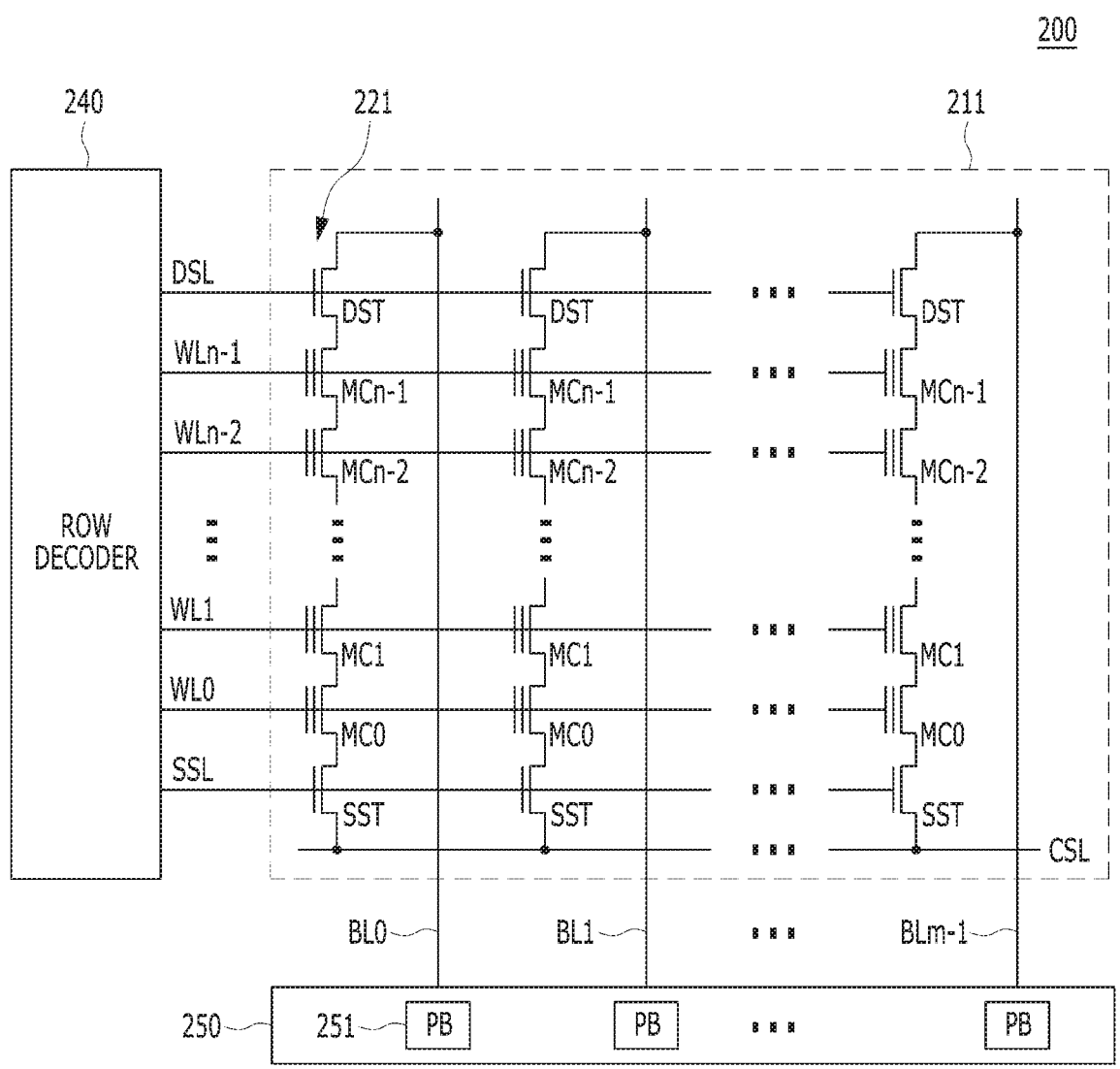
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word is lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

A memory device such as a flash memory (e.g., NAND flash memory) may include a plurality of memory blocks (e.g., hundreds to thousands of memory blocks). Each block typically may include a plurality of wordlines (e.g., hundreds of wordlines). Each cell coupled to each wordline may include multiple logical pages. The memory device may include a plurality of memory cells and store multiple bits per cell by modulating the cell into different states or program voltage (PV) levels through a programming operation.

Figure 4:
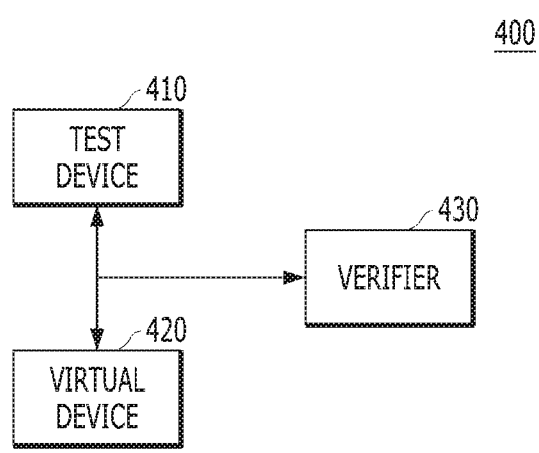
FIG. 4 is a diagram illustrating a simulation system in accordance with an embodiment of the present invention.

FIG. 4 is a diagram illustrating a simulation system 400 in accordance with an embodiment of the present invention.

Referring to FIG. 4, the simulation system 400 may include a test device 410, a virtual device 420 and a verifier 430. The virtual device 420 may include simulator components which individually or in combination with other components implement a certain simulator feature. The simulation system 400 may be used for a memory system such as NAND flash-based SSDs.

The test device 410 may generate a test command for the virtual device 420. The virtual device 420 may be a simulation target for testing. In some embodiments, the virtual device 420 may be a memory system 10 of FIG. 2. The virtual device 420 may include multiple subsystems and a storage. The multiple subsystems may be embodied in, or implemented by, a memory controller, such as that shown in FIG. 2. The storage of the virtual device 420 may correspond to the storage 110 of FIG. 2. Each of the multiple subsystems may include firmware. One or more of the multiple subsystems may be configured based on firmware development stage. The virtual device 420 may receive the test command from the test device 410, and perform a test on corresponding firmware of the configured subsystem using the test command.

The verifier 430 may monitor the test performed by the virtual device 420. The verifier 430 may be a simulator component which monitors behavior of the virtual device 420 and compares it with a reference behavior.

In some embodiments, the virtual device 420 may communicate with the test device 410 using any of various protocols, e.g., a non-volatile memory express (NVMe), a serial advanced technology attachment (SATA) and/or a universal flash storage (UFS) protocols.

Figure 5:
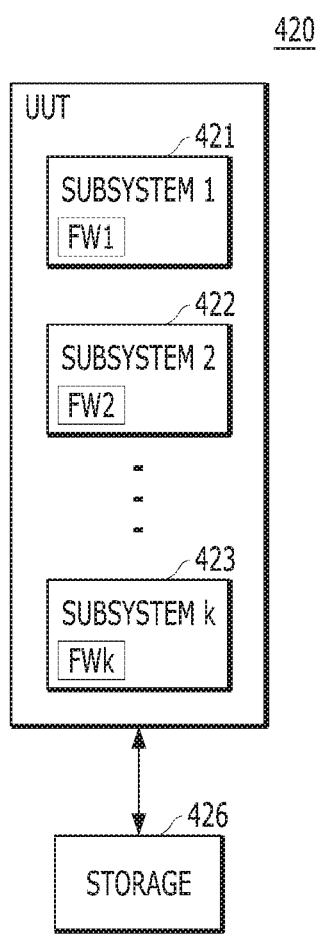
FIG. 5 is a diagram illustrating a virtual device in accordance with an embodiment of the present invention.

FIG. 5 is a diagram illustrating a virtual device 420 in accordance with an embodiment of the present invention.

Referring to FIG. 5, the virtual device 420 may include multiple subsystems 421 to 423 as unit under test (UUT) and a storage 426. Each of the multiple subsystems 421 to 423 may be a combination of hardware and corresponding firmware. In other words, a first subsystem 421 may include first firmware (FW1), a second subsystem 422 may include second firmware (FW2) and a kth subsystem 423 may include kth firmware (FWk). For example, the kth subsystem 423 may be a third subsystem including 3rd firmware (FW3). Each of the multiple subsystems 421 to 423 may implement a certain simulator feature among a simulator feature set, individually or in combination with other components. The simulator feature set may be a plurality of features which is required on a certain development stage.

In some embodiments, the first subsystem 421 may be a host subsystem and include a host interface layer (HIL). The second subsystem 422 may be a flash subsystem and include a flash translation layer (FTL). The third subsystem 423 may be a NAND subsystem and include a flash interface layer (FIL).

The storage 426 may be a simulator component which simulates behavior of a cell array such as a NAND flash array.

Figure 6:
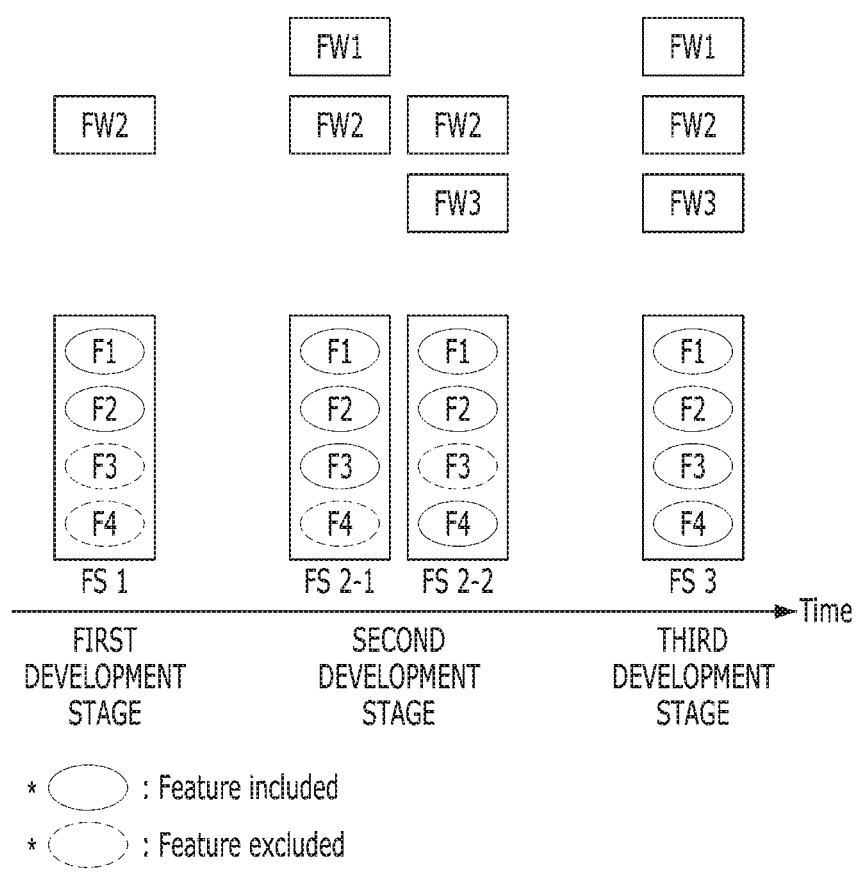
FIG. 6 is a diagram illustrating a configuration operation of firmware in accordance with an embodiment of the present invention.

FIG. 6 is a diagram illustrating a configuration operation of firmware in accordance with an embodiment of the present invention.

Referring to FIG. 6, the configuration operation may configure at least one item of firmware among multiple items of firmware FW1 to FW3 of the multiple subsystems 421 to 423 based on a target firmware development stage. In some embodiments, there are multiple target firmware development stages, including a first development stage, a second development stage subsequent to the first development stage and a third development stage subsequent to the second development stage.

In various embodiments, simulator features sets may be modified by reconfiguring the multiple subsystems 421 to 423 as the simulator components and the test device 410.

At the first development stage, the configuration operation may configure the firmware FW2 of the second subsystem 422. During the first development stage, a given simulator feature set may be modified to exclude one or more features, among all of the available features. For example, as shown in FIG. 6, simulator feature set FS1 may be modified to only include features F1 and F2.

At the second development stage, the configuration operation may configure the firmware FW1 of the first subsystem 421 and the firmware FW2 of the second subsystem 422. Therefore, simulator feature set FS2-1 may be modified to include features F1, F2 and F3. Alternatively, the configuration operation may configure the firmware FW2 of the second subsystem 422 and the firmware FW3 of the third subsystem 423. In this case, simulator feature set FS2-2 may be modified to include features F1, F2 and F4.

At the third development stage, the configuration operation may configure the firmware FW1 of the first subsystem 421, the firmware FW2 of the second subsystem 422 and the firmware FW3 of the third subsystem 423. Therefore, simulator feature set FS3 may be modified to include features F1, F2, F3 and F4.

Figure 7:
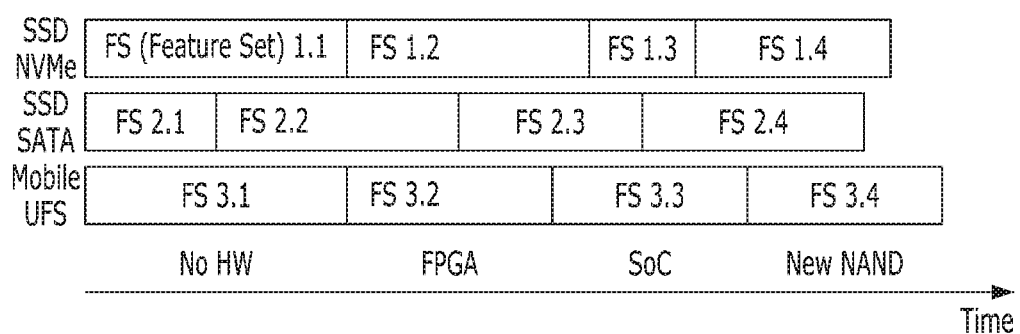
FIG. 7 is a diagram illustrating an operation for modifying simulation feature sets in accordance with an embodiment of the present invention.

FIG. 7 is a diagram illustrating an operation for modifying simulation feature sets in accordance with an embodiment of the present invention.

Referring to FIG. 7, simulation feature sets may be modified based on a firmware development stage. There may be multiple firmware development stages including a no-hardware (No HW) stage, a field-programmable gate array (FPGA) stage subsequent to the No HW stage, a system-on-a-chip (SoC) stage subsequent to the FPGA stage and a new NAND stage subsequent to the SoC stage.

Simulation feature sets for SSD NVMe may include FS 1.1, FS 1.2, FS 1.3 and FS 1.4. Simulation feature sets for SSD SATA may include FS 2.1, FS 2.2, FS 2.3 and FS 2.4. Simulation feature sets for mobile UFS may include FS 3.1, FS 3.2, FS 3.3 and FS 3.4. Each simulation feature set may include a plurality of simulation features as shown in FIG. 8.

FIG. 8 is a diagram illustrating simulation feature sets in accordance with an embodiment of the present invention. FIG. 8 shows simulation feature sets for SSD NVMe.

Referring to FIG. 8, the simulation feature sets may include simulation feature sets FS 1.1, FS 1.2, FS 1.3 and FS 1.4. Each of the simulation feature sets may include at least one feature among a plurality of simulation features.

In some embodiments, the plurality of simulation features is may include fault injector, storage, preconditioning, white box test, end of life (EOL) test and fast simulation as the following:

Fault injector provides the possibility to specify conditions for flash subsystem misbehavior. Fault injector allows developing and testing firmware error handling features in a reproducible and controlled manner.

Storage provides the possibility to store flash array state, which consists of blocks and pages along with their faults (if any have been injected). Storage allows compactly storing firmware system data and host data in in a physical DRAM, HDD, or SSD device.

EOL test provides the possibility of fast aging of flash array to the end-of-life condition. EOL test allows testing specific firmware algorithms, such as wear-levelling.

Preconditioning enables generating or saving/loading flash array state. Preconditioning allows quickly switching firmware to the target state, such as steady state.

Fast simulation provides the possibility to use Unit Testing approach with Test doubles: objects or procedures that look and behave like their release-intended counterparts, but which actually represent simplified versions that reduce the complexity and facilitate testing. Test doubles are gradually replaced with HW models to enable simulation accuracy growth. Examples of HW models: Host controller, DRAM (NVMe and SATA only), SRAM, Memory management, HW accelerators, CPU, Timers, Security, Flash controller.

White-box test feature allows sending information about internal firmware behavior to test device. This allows developing test scenarios with the knowledge of firmware implementation for more efficient testing.

FS 1.1 may include storage and fast simulation. FS 1.2 may include fault injector, storage, EOL test and fast simulation. FS 1.3 may include fault injector, storage, preconditioning, white box test and EOL test. FS 1.4 may include fault injector, storage, preconditioning and white box test.

Referring back to FIG. 7, as for SSD NVMe, at the no-hardware (No HW) stage, the simulator feature set may be configured as FS 1.1. At the FPGA stage, the simulator feature set may be configured as FS 1.2. At the SoC stage, the simulator feature set may be configured as FS 1.3. At the New NAND stage, the simulator feature set may be configured as FS 1.4.

Each feature set (SSD NVMe, SSD SATA, SSD UFS) has its own version and configuration of fault injector, storage, preconditioning, white box test and EOL test. These features are specific for SSD NVMe, SSD SATA, SSD UFS firmware policies and algorithms. Besides, each feature set has its own version and configuration of fast simulation with test doubles and/or HW models, which are specific for SoC (e.g., SSD NVMe, SSD SATA, SSD UFS). As for SSD SATA, at the no-hardware (No HW) stage, the simulator feature set may be configured as FS 2.1. At the FPGA stage, the simulator feature set may be configured as FS 2.2. At the SoC stage, the simulator feature set may be configured as FS 2.3. At the New NAND stage, the simulator feature set may be configured as FS 2.4.

As for mobile UFS, at the no-hardware (No HW) stage, the simulator feature set may be configured as FS 3.1. At the FPGA stage, the simulator feature set may be configured as FS 3.2. At the SoC stage, the simulator feature set may be configured as FS 3.3. At the New NAND stage, the simulator feature set may be configured as FS 3.4.

The feature sets needed at each stage and for each component, i.e., SSD NVMe, may be mainly defined by the readiness and availability of firmware and hardware in the component itself.

At the early stage, the hardware may not be available; hence, even basic and limited simulation may be valuable. At the same time, firmware is usually not ready to handle complex corner cases, such as NAND program failure handling, read errors handling, performance and latency optimization. So there is no need for the fault injection feature at an early stage, e.g., No HW. That is, at the no hardware stage, a basic feature set may be enough.

As the development continues, more throughput simulation may be required because basic testing and development may be done using hardware. At the stage when FPGA is available, the basic feature set becomes insufficient. For example, fault injection and EOL test may be added to the simulation environment.

At the stage when SoC appears, the simulator must provide the feature set that is suitable for the testing and development needs at this stage, such as White-Box testing, and switch fast simulation to more accurate simulation.

Further in development, full integration testing may be required. At this stage, e.g., New NAND stage, due to simulation complexity, simulation performance suffers. However, testing on hardware may be used for higher performance because the hardware is available at this later stage. To speed up the testing, an image of device may be prepared using firmware algorithms outside of simulation to avoid long-running preconditioning in every test.

As described above, the simulation system 400 may be used for firmware testing of a memory system such as NAND flash-based SSDs. The simulation system 400 may include a virtual device (VD) 420. The virtual device 420 may include three logical parts or subsystems 421 to 423. Each of the subsystems 421 to 423 may be a combination of hardware and a specific firmware layer.

In some embodiments, as shown in FIGS. 9 and 12 to 14, the first subsystem 421 may be implemented as a host subsystem (H-Sub) 421A, the second subsystem 422 may be implemented as a flash subsystem (F-Sub) 422A, and the third subsystem 423 may be implemented as a NAND subsystem (N-Sub) 423A.

Figure 9:
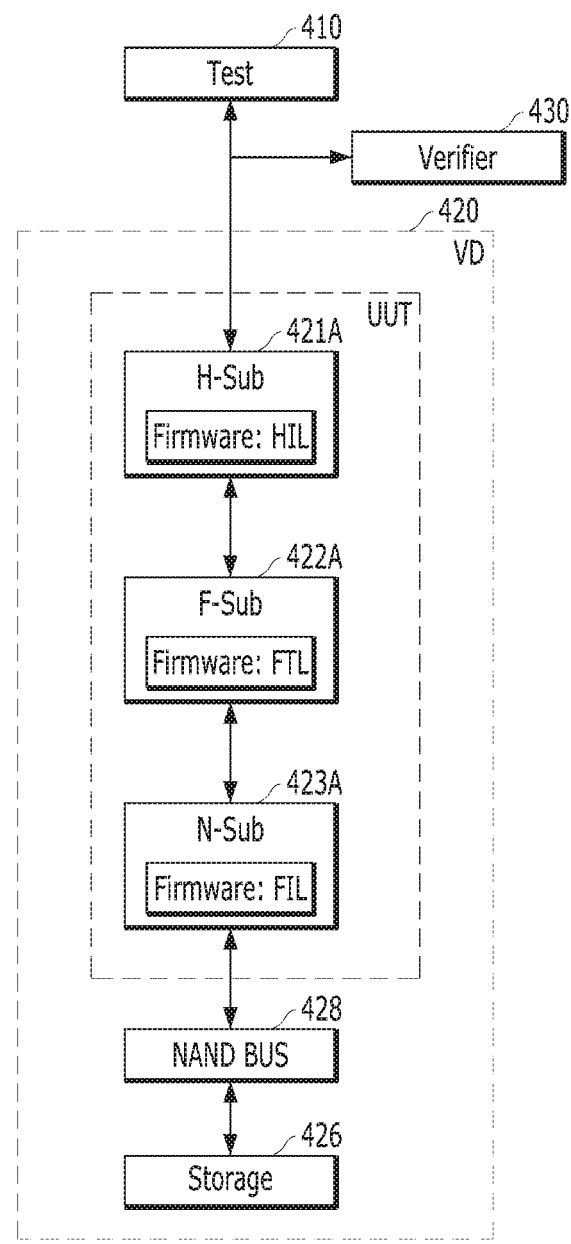
FIG. 9 is a diagram illustrating a whole firmware testing operation in accordance with an embodiment of the present invention.

Referring to FIG. 9, the virtual device 420 may include the host subsystem 421A, the flash subsystem 422A, and the NAND subsystem 423A, which collectively represent the unit under test (UUT). The virtual device 420 may further include a storage 426 and a NAND bus component 428.

The storage 426 may be a simulator component which simulates behavior of a cell array such as a NAND flash array. The NAND bus component 428 may be a simulator component which simulates open NAND flash interface (ONFI) bus activity such as command execution, a change of a ready/busy signal.

The host subsystem 421A may be controlled by the host interface layer (HIL). The host subsystem 421A may handle specific activity based on a protocol. The host subsystem 421A may receive commands (or requests) for read and write operations from the test device 410. Further, the host subsystem 421A may forward the commands to the flash subsystem 422A. In some embodiments, the commands may correspond to features of a feature set in FIG. 8.

The flash subsystem 422A may be controlled by the flash translation layer (FTL), The flash subsystem 422A may translate host logical addresses into NAND flash physical addresses. Further, the flash subsystem 422A may translate logical read and write requests into NAND flash operation requests and forward the NAND flash operation requests to the NAND subsystem 423A.

The NAND subsystem 423A may be controlled by the flash interface layer (FIL). The NAND subsystem 423A may handle and perform NAND flash operations for the storage 426 including a flash cell array. In some embodiments, the NAND flash operations may include sensing, programming, erasing, uncorrectable error correction code (UECC) correction, and page buffer caching.

In some embodiments, a reconfigurable simulation method for NAND flash firmware may allow simulating necessary subsystems of a virtual device depending on requirements. The simulation system (or simulator) based on the reconfigurable simulation method may allow reconfiguring the necessary components for a particular target firmware development stage, instead of using the same configuration at all development stages.

Figure 11:
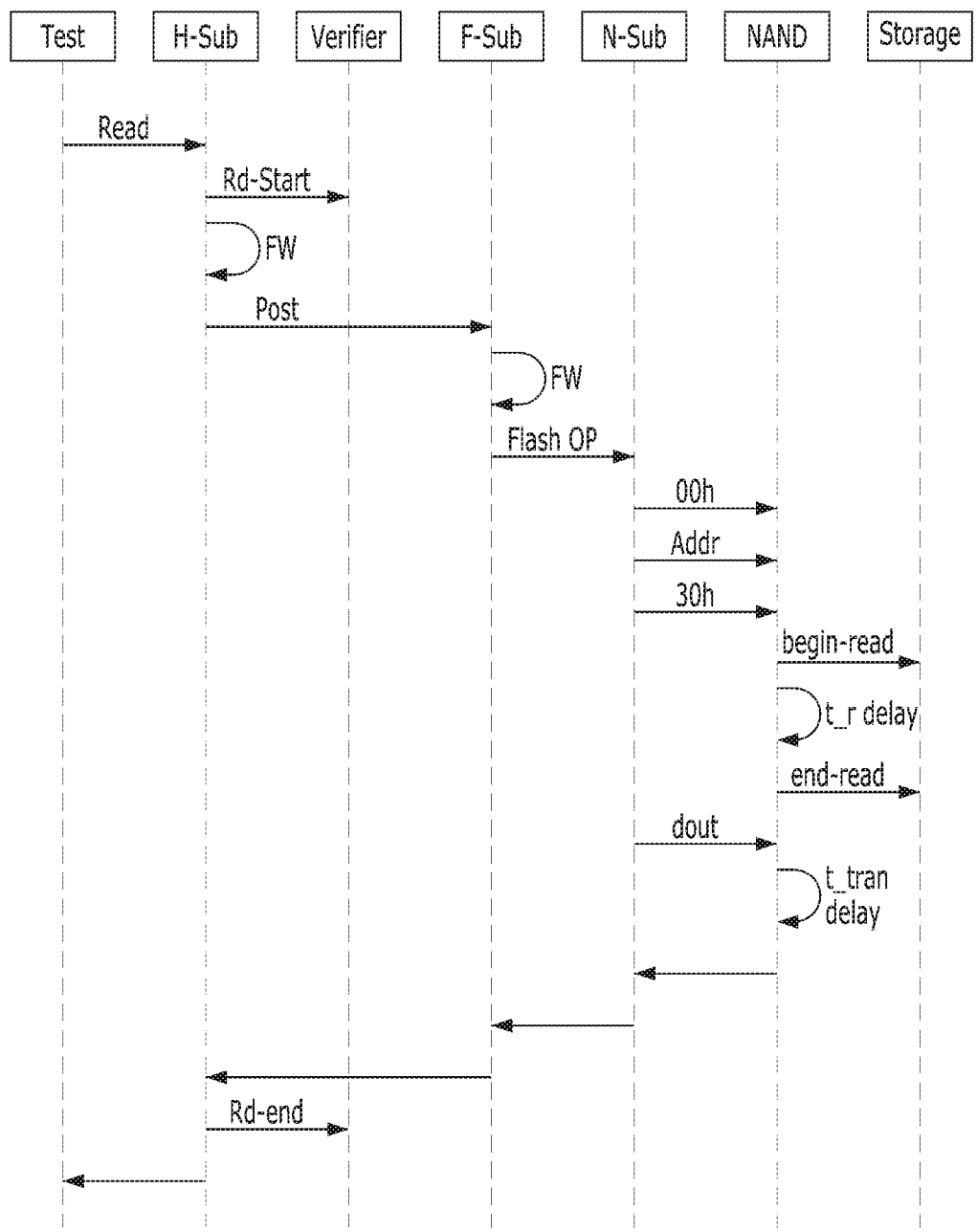
FIG. 11 is a diagram illustrating a test read sequence in accordance with an embodiment of the present invention.
Figure 12:
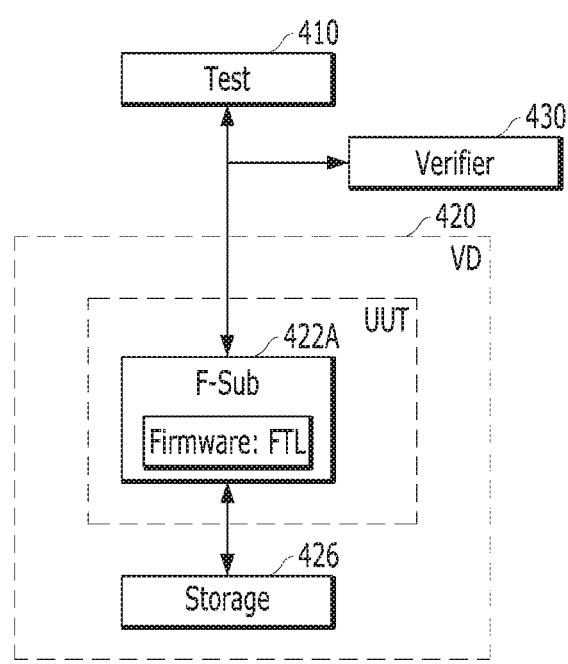
FIGS. 12 to 14 are diagrams illustrating partial firmware testing operations in accordance with an embodiment of the present invention.
Figure 13:
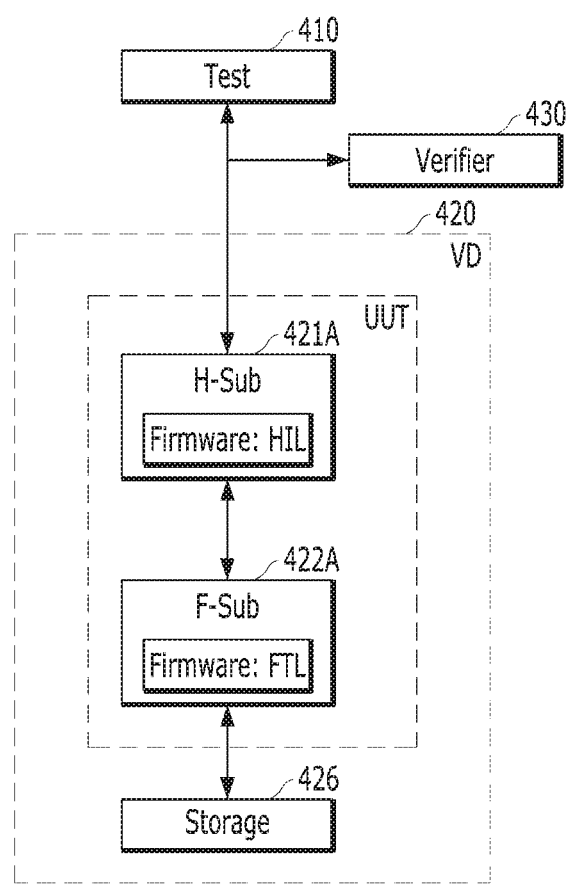
Figure 14:
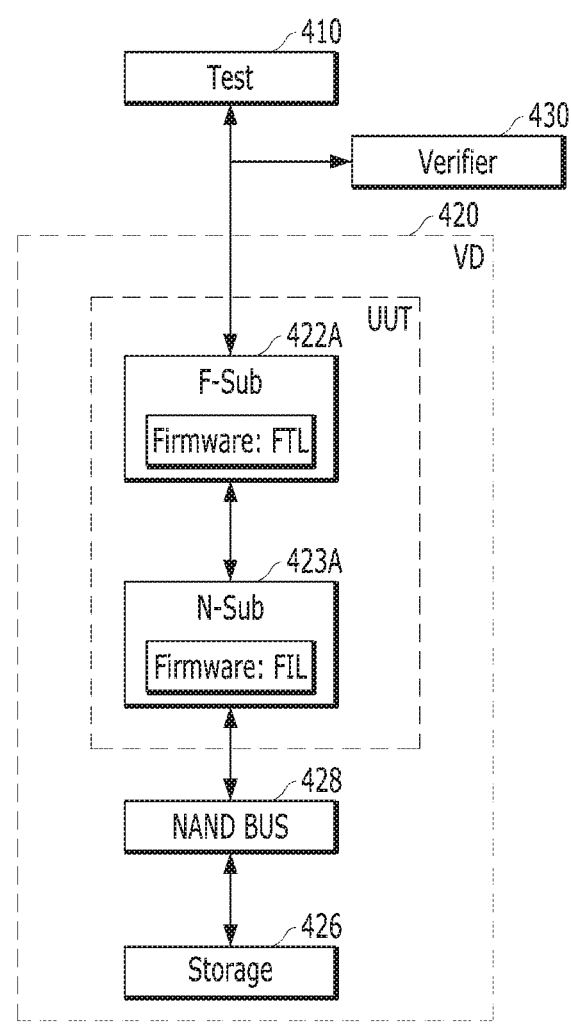

The simulation system may allow simulation for testing all of the firmware (see FIG. 9) or simulation for testing some of the firmware, e.g., firmware on one or more, but less than all of the, subsystems (see FIGS. 12 to 14). Simulator feature sets may be modified by reconfiguring which of the features are included in a given simulator feature set. That, in turn, results in reconfiguration of the associated subsystem. Subsystems may be configured in different ways. By way of example, possible configurations are described with reference to FIGS. 9 to 14. It should be noted that the scope of the present invention is not limited thereto.

FIG. 9 is a diagram illustrating entire firmware testing operation in accordance with an embodiment of the present invention.

Referring to FIG. 9, all subsystems may be used for firmware testing operation. In other words, the virtual device 420 may be configured to include the host subsystem 421A, the flash subsystem 422A, the NAND subsystem 423A, the NAND bus component 428 and the storage 426. This configuration may be used for the target firmware development stage such as the SoC sage or the New NAND stage of FIG. 7, which corresponds to feature set 1.3 or 1.4 of FIG. 8.

Figure 10:
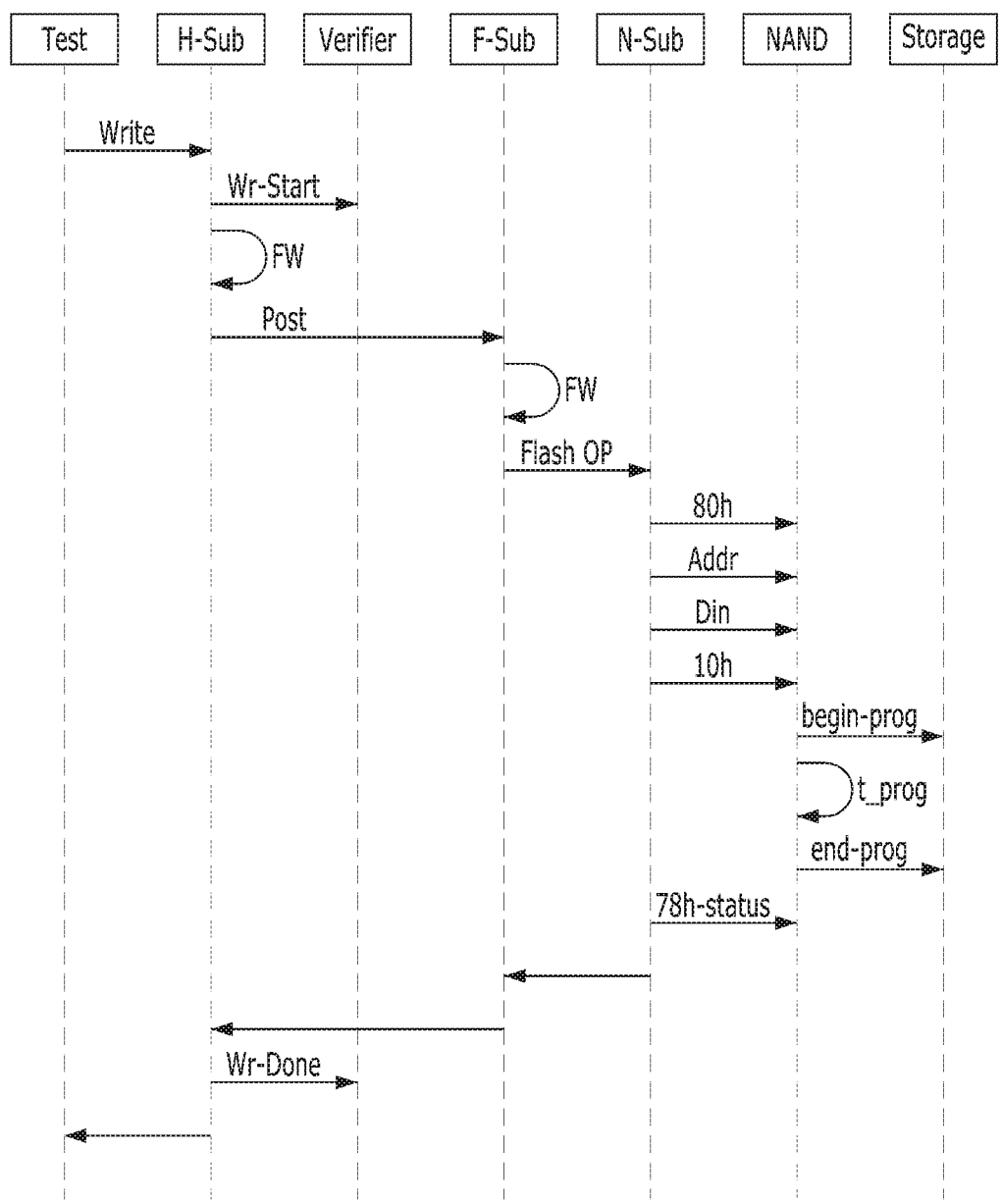
FIG. 10 is a diagram illustrating a test write sequence in accordance with an embodiment of the present invention.

In the overall firmware testing operation, a test write operation may be performed according to a sequence as shown in FIG. 10. Further, a test read operation may be performed according to a sequence as shown in FIG. 11.

Referring to FIG. 10, the test device (Test) may send a command Write( ) for a write operation to the host subsystem (H-Sub) 421A. The host subsystem (H-Sub) 421A may forward a command (Post) to the flash subsystem (F-Sub) 422A. The flash subsystem (F-Sub) 422A may forward a command (FlashOP) to the NAND subsystem (N-Sub) 423A. The NAND subsystem (N-Sub) 423A may provide data (Din) and address (Addr) to the storage 426 through the NAND bus component 428. Therefore, the write operation may be performed for the storage 426.

Referring to FIG. 11, the test device (Test) may send a command Read( ) for a write operation to the host subsystem (H-Sub) 421A. The host subsystem (H-Sub) 421A may forward a command Post to the flash subsystem (F-Sub) 422A. The flash subsystem (F-Sub) 422A may forward a command (FlashOP) to the NAND subsystem (N-Sub) 423A. The NAND subsystem (N-Sub) 423A may provide address (Addr) to the storage 426 through the NAND bus component 428. Therefore, the read operation may be performed for the storage 426.

FIGS. 12 to 14 are diagrams illustrating partial firmware testing operations in accordance with an embodiment of the present invention.

Referring to FIG. 12, only one subsystem may be used for partial firmware testing operation. In other words, the flash subsystem 422A may be configured for coupling with the storage 426. The test device may be reused because the test device can work with different protocols. Instead of communicating commands to the host subsystem (H-Sub) 421A, the test device may communicate with the flash subsystem (F-Sub) 422A directly via generic protocol. This configuration may be used for the target firmware development stage such as the No-HW stage of FIG. 7, which corresponds to the basic feature set 1.1 of FIG. 8.

Referring to FIG. 13, a combination of two subsystems may be used for partial firmware testing operation. In other words, the host subsystem (H-Sub) 421A and the flash subsystem 422A may be configured for coupling with the storage 426. This configuration may be used for the target firmware development stage such as the FPGA stage of FIG. 7, which corresponds to the feature set 1.2 of FIG. 8. At the target firmware development stage, the NAND subsystem (N-Sub) 423A is omitted because the NAND subsystem (N-Sub) 423A is slow to simulate and difficult to develop and the NAND subsystem (N-Sub) 423A may not be ready. The flash subsystem (F-Sub) 422A may communicate directly with the storage 426 without the NAND bus component 428.

Referring to FIG. 14, a combination of two subsystems may be used for the partial firmware testing operation. In other words, the flash subsystem 422A and the NAND subsystem (N-Sub) 423A may be configured for coupling with the storage 426 through the NAND bus component 428. This configuration may be used for the target firmware development stage such as the SoC stage of FIG. 7, which corresponds to the feature set 1.3 of FIG. 8. At the target firmware development stage, the NAND subsystem (N-Sub) 423A may communicate with the storage 426 through the NAND bus component 428.

As described above, instead of using the same configuration for each subsystem and/or at each development stage, embodiments of the present invention provide flexibility for testing firmware using different configurations for different subsystems at different stages of firmware development of a memory system.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A simulation system comprising:
a test device suitable for generating a test command;
a virtual device suitable for configuring at least one of multiple subsystems and a storage for simulation, wherein, for each of the multiple subsystems simulated, a group of feature sets corresponding to multiple development stages for the corresponding subsystem are provided, a feature set is selected among the group of feature sets, the selected feature set corresponding to a particular one of the multiple development stages at which the corresponding subsystem is simulated,
wherein simulation is performed in response to the test command.

2. The simulation system of claim 1, wherein the storage includes a flash array,
wherein the multiple subsystems include a host subsystem, a flash subsystem and a NAND subsystem, and
wherein the host subsystem includes a host interface layer (HIL), the flash subsystem includes a flash translation layer (FTL) and the NAND subsystem includes a flash interface layer (FIL).

3. The simulation system of claim 2, wherein the virtual device further includes a bus component coupled between the NAND subsystem and the storage.

4. The simulation system of claim 2, wherein the multiple development stages includes a first stage, a second stage subsequent to the first stage and a third stage subsequent to the second stage.

5. The simulation system of claim 4, wherein the virtual device configures the flash subsystem, at the first stage.

6. The simulation system of claim 4, wherein the virtual device configures the host subsystem and the flash subsystem, or configures the flash subsystem and the NAND subsystem, at the second stage.

7. The simulation system of claim 4, wherein the virtual device configures the host subsystem, the flash subsystem, and the NAND subsystem, at the third stage.

8. The simulation system of claim 2, wherein one of the multiple subsystems includes a non-volatile memory express (NVMe).

9. The simulation system of claim 8, wherein the each feature set of the group of feature sets for the NVMe is configured as one or more of fault injector, storage, preconditioning, white box test, end of life (EOL) test and fast simulation.

10. The simulation system of claim 2, wherein the virtual device communicates with the test device based on a non-volatile memory express (NVMe) protocol, a serial advanced technology attachment (SATA) protocol or a universal flash storage (UFS) protocol.

11. The simulation system of claim 2, further comprising a verifier suitable for monitoring the test.

12. A method for simulating a memory system comprising:
configuring at least one of multiple subsystems and a storage for simulation, wherein, for each of the multiple subsystems simulated, a group of feature sets corresponding to multiple development stages for the corresponding subsystem are provided, a feature set is selected among the group of feature sets, the selected feature set corresponding to a particular one of the multiple development stages at which the corresponding subsystem is simulated; and
performing a test on each configured subsystem with the storage using a test command.

13. The method of claim 12, wherein the storage includes a flash array,
wherein the multiple subsystems include a host subsystem, a flash subsystem and a NAND subsystem, and
wherein the host subsystem includes a host interface layer (HIL), the flash subsystem includes a flash translation layer (FTL) and the NAND subsystem includes a flash interface layer (FIL).

14. The method of claim 13, wherein the virtual device further includes a bus component coupled between the NAND subsystem and the storage.

15. The method of claim 13, wherein the multiple development stages includes a first stage, a second stage subsequent to the first stage and a third stage subsequent to the second stage.

16. The method of claim 15, wherein the configuring of the at least one of multiple subsystems comprises configuring the flash subsystem, at the first stage.

17. The method of claim 15, wherein the configuring of the at least one of multiple subsystems comprises configuring the host subsystem and the flash subsystem, or configuring the flash subsystem and the NAND subsystem, at the second stage.

18. The method of claim 15, wherein the configuring of the at least one of multiple subsystems comprises configuring the host subsystem, the flash subsystem, and the NAND subsystem, at the third stage.

19. The method of claim 13, wherein the performing of the test comprises performing the test on a non-volatile memory express (NVMe), as one of the multiple subsystems,
wherein each feature set of the group of feature sets for the NVMe is configured as one or more of fault injector, storage, preconditioning, white box test, end of life (EOL) test and fast simulation.

20. The method of claim 13, further comprising: receiving the test command based on a non-volatile memory express (NVMe) protocol, a serial advanced technology attachment (SATA) protocol or a universal flash storage (UFS) protocol.

* * * * *